United States Patent
Liu et al.

(10) Patent No.: US 11,557,625 B2
(45) Date of Patent: Jan. 17, 2023

(54) IMAGE SENSORS WITH EMBEDDED WELLS FOR ACCOMMODATING LIGHT EMITTERS

(71) Applicant: OmniVision Technologies, Inc., Santa Clara, CA (US)

(72) Inventors: Chia-Ying Liu, Hsinchu (TW); Wu-Zang Yang, ShiHu Town (TW); Chia-Jung Liu, Hsinchu (TW); Ming Zhang, Fremont, CA (US); Yin Qian, Milpitas, CA (US); Alireza Bonakdar, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 219 days.

(21) Appl. No.: 16/853,684

(22) Filed: Apr. 20, 2020

(65) Prior Publication Data

US 2021/0327948 A1  Oct. 21, 2021

(51) Int. Cl.
*H01L 27/146* (2006.01)
*H01L 31/0216* (2014.01)
*H01L 31/14* (2006.01)
*H01L 31/0352* (2006.01)

(52) U.S. Cl.
CPC .... *H01L 27/14643* (2013.01); *H01L 27/1463* (2013.01); *H01L 27/14603* (2013.01); *H01L 31/02164* (2013.01); *H01L 31/035236* (2013.01); *H01L 31/143* (2013.01)

(58) Field of Classification Search
CPC ......... H01L 27/14643; H01L 27/14603; H01L 27/1463; H01L 31/02164; H01L 31/035236; H01L 31/143; H01L 31/035272
See application file for complete search history.

(56) References Cited

U.S. PATENT DOCUMENTS 9,574,991 B2  2/2017  Zhang
2019/0204226 A1*  7/2019  Fung ................. H01L 27/14621

FOREIGN PATENT DOCUMENTS

DE  102018126875 A1 *  5/2019  ....... H01L 27/14607

OTHER PUBLICATIONS

Russell, D., "The past, present, and future of DNA sequencing" Spring 2015, 81 pages.
ThermoFisher Scientific, Ion 316™ Chip Kit v2 BC, Catalog No. 4488149; accessed on the Internet Jun. 22, 2020, https://www.thermofisher.com/order/catalog/product/4488149#/4488149, 3 pages.

* cited by examiner

Primary Examiner — Sitaramarao S Yechuri
(74) Attorney, Agent, or Firm — Lathrop GPM LLP

(57) ABSTRACT

An image sensor with embedded wells for accommodating light emitters includes a semiconductor substrate including an array of doped sensing regions respectively corresponding to an array of photosensitive pixels of the image sensor. The semiconductor substrate forms an array of wells. Each well is aligned with a respective doped sensing region to facilitate detection, by the photosensitive pixel that includes said respective doped sensing region, of light emitted to the photosensitive pixel by a light emitter disposed in the well. The image sensor further includes, between adjacent doped sensing regions, a light-blocking barrier to reduce propagation of light to the doped sensing-region of each photosensitive pixel from wells not aligned therewith.

20 Claims, 7 Drawing Sheets

IMAGE SENSORS WITH EMBEDDED WELLS FOR ACCOMMODATING LIGHT EMITTERS

BACKGROUND

Deoxyribonucleic acid (DNA) is a molecule composed of two chains that coil around each other to form a double helix carrying genetic instructions for the development, functioning, growth and reproduction of all known organisms and many viruses. The two DNA strands are composed of nucleotides. Each nucleotide includes one of four nitrogen-containing nucleobases: cytosine (C), guanine (G), adenine (A) or thymine (T)). The two DNA strands are bound to each other via hydrogen bonds between the nucleobases, according to base pairing rules pairing A with T and C with G.

DNA sequencing is the process of determining the sequence (i.e., physical order) of nucleobases in DNA. DNA sequencing may be used to determine the sequence of individual genes, larger genetic regions (i.e., clusters of genes or operons), full chromosomes, or entire genomes of any organism. While DNA sequencing has historically been an extraordinarily time-consuming endeavor, the recent advent of "rapid" and less expensive DNA sequencing techniques has made DNA sequencing a key technology in many areas of biology and other sciences such as medicine, forensics, and anthropology.

Many rapid DNA sequencing techniques are based on parallel sequencing of small fragments of the full DNA to be sequenced. In DNA nanoball sequencing, the DNA to be sequenced is sheared it into small fragments, and each fragment then undergoes a replication to produce a concatenated strand of many copies of the fragment coiled into a nanoball having a diameter of about 300 nanometers. Many nanoballs may be attached to different respective locations of a flow cell, and the nanoballs may then be sequenced in parallel by flowing a series of nucleobases through the flow cell while detecting binding of the nucleobases to each nanoball.

Shotgun sequencing is a scheme that may be applied to a variety of rapid DNA sequencing techniques based on parallel sequencing of small fragments. In shotgun sequencing, the fragmentation is random. After sequencing the individual random fragments, the sequenced patterns are stitched together based on an analysis of overlaps between the patterns.

SUMMARY

In an embodiment, an image sensor with embedded wells for accommodating light emitters includes a semiconductor substrate including an array of doped sensing regions respectively corresponding to an array of photosensitive pixels of the image sensor. The semiconductor substrate forms an array of wells. Each well is aligned with a respective doped sensing region to facilitate detection, by the photosensitive pixel that includes said respective doped sensing region, of light emitted to the photosensitive pixel by a light emitter disposed in the well. The image sensor further includes, between adjacent doped sensing regions, a light-blocking barrier to reduce propagation of light to the doped sensing-region of each photosensitive pixel from wells not aligned therewith.

In an embodiment, a method for manufacturing an image sensor with embedded wells for accommodating light emitters includes (a) etching an array of wells in a first surface of a semiconductor substrate, (b) etching trenches in the first surface such that the trenches, after the step of etching the array of wells, are between adjacent wells, and (c) depositing, in the trenches, deep-trench isolation including a light-blocking material that, when the semiconductor substrate includes an array of doped sensing regions respectively aligned with the array of wells, reduces propagation of light from each well to doped sensing region not aligned with the well.

BRIEF DESCRIPTION OF THE DRAWINGS

FIG. 1 is a cross-sectional view of the image sensor in an example use scenario. FIG. 2 is a top view of the image sensor.

DESCRIPTION OF EXAMPLE EMBODIMENTS

Figure 1:
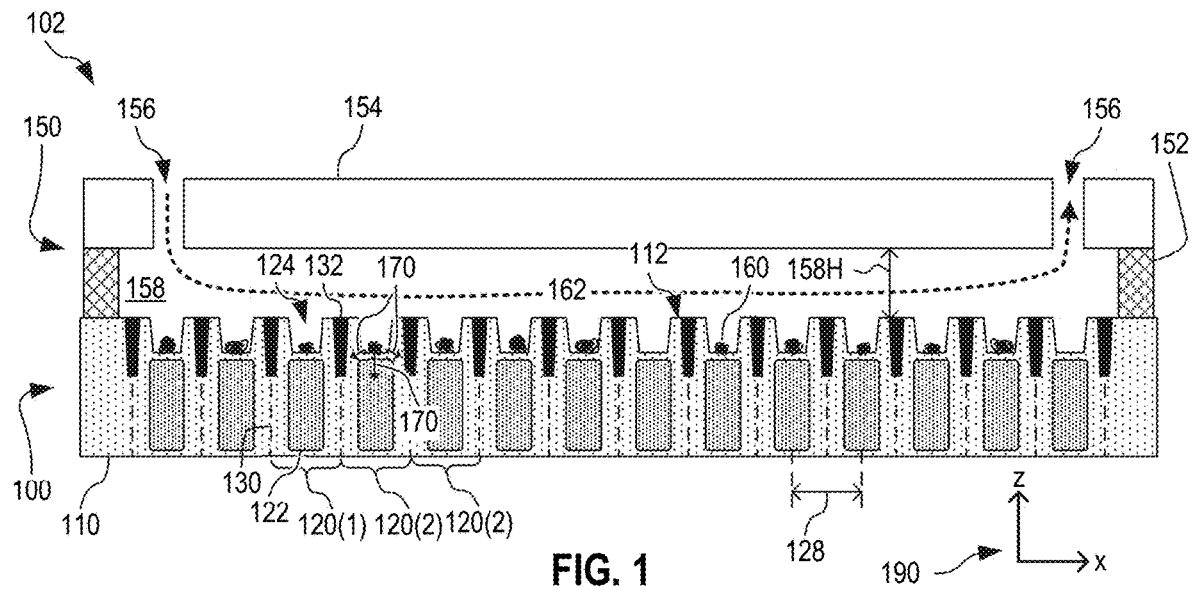
FIGS. 1 and 2 illustrate an image sensor with embedded wells for containing light emitters to be evaluated by the image sensor, according to an embodiment.
Figure 2:
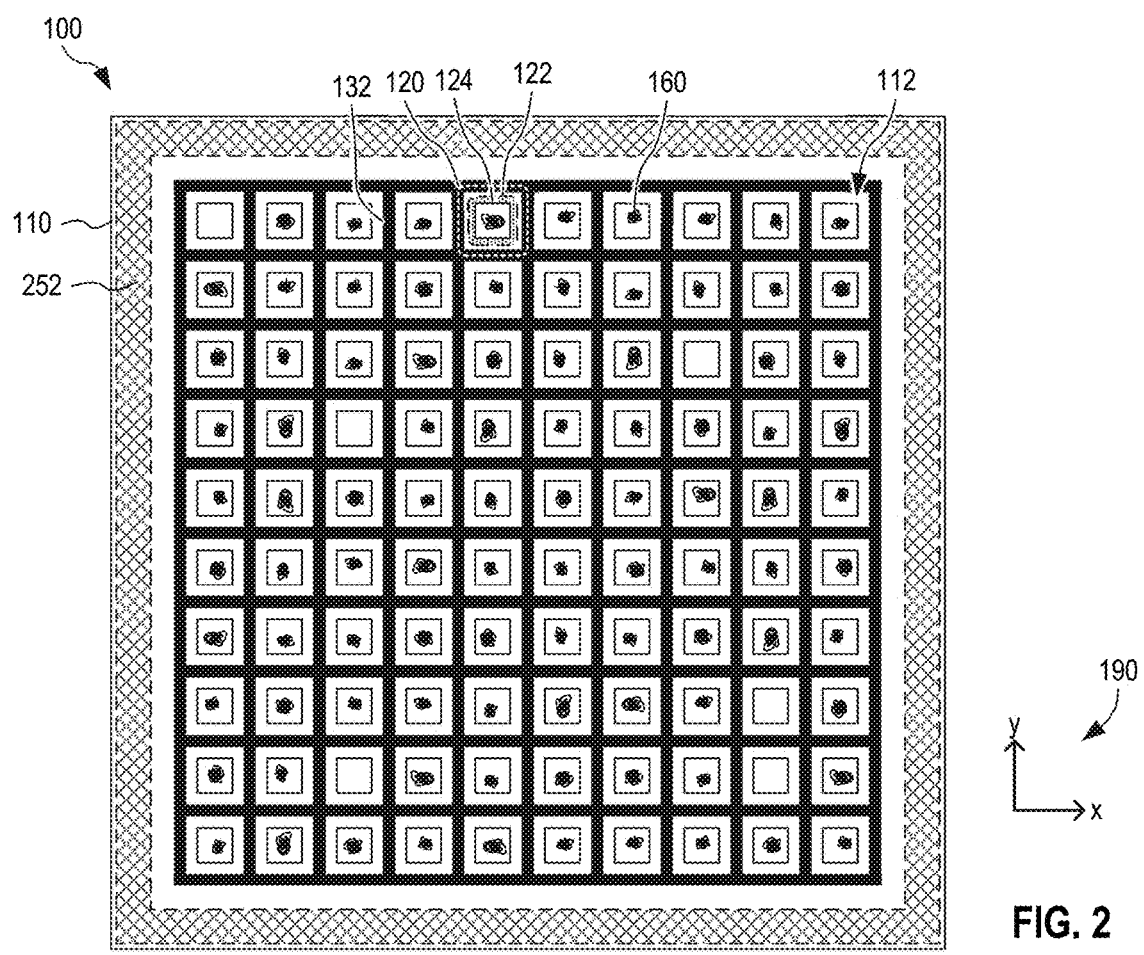

FIGS. 1 and 2 illustrate one image sensor 100 with embedded wells for containing light emitters to be evaluated by the image sensor. FIG. 1 is a cross-sectional view of image sensor 100 in an example use scenario. FIG. 2 is a top view of image sensor 100. FIGS. 1 and 2 further show a right-handed cartesian coordinate system 190. The cross section of FIG. 1 is in the xz-plane of coordinate system 190, while the FIG. 2 view is in the xy-plane of coordinate system 190. FIGS. 1 and 2 are best viewed together in the following description. Image sensor 100 includes an array of photosensitive pixels 120, each configured to detect light emitted by a respective light emitter 160 disposed in a well 124 embedded in photosensitive pixel 120. Image sensor 100 is thus well-suited for parallel processing of a large number of light emitters 160 by near-field imaging.

Each light emitter 160 is, for example, (a) a biological or chemical sample that may emit light (such as fluorescence in response to, e.g., ultraviolet excitation, or luminescence caused by a reaction), (b) one or more quantum dots that may fluoresce in response to, e.g., ultraviolet excitation, or (c) a light-emitting device such as a light-emitting diode.

Each light emitter 160 may emit light in the ultraviolet, visible, and/or infrared wavelength range. In one use scenario, each light emitter 160 is a DNA sample or DNA fragment.

It is understood that image sensor 100 may include more or fewer pixels 120 than depicted in FIGS. 1 and 2. Image sensor 100 may, for example, include thousands or millions of pixels 120.

As compared to devices where samples, or other forms of light emitters, are placed on top of or above the image sensor for near-field imaging, image sensor 100 benefits from improved light detection efficiency. Image sensor 100 is further configured to reduce or eliminate crosstalk between pixels. The combination of improved light collection efficiency and suppression of crosstalk results in image sensor 100 having improved sensitivity for detection of light emitted by light emitters 160 disposed in wells 124.

Image sensor 100 includes a semiconductor substrate 110 that includes an array of doped sensing regions 122. Image sensor 100 may be a complementary metal oxide semiconductor (CMOS) image sensor, and semiconductor substrate 110 may be a silicon substrate. Each doped sensing region 122 belongs to a respective photosensitive pixel 120 of the pixel array of image sensor 100. In one embodiment, semiconductor substrate 110 is generally p-doped, except for in doped sensing regions 122 where semiconductor substrate 110 is n-doped. In other embodiments, polarity may be reversed, for example with p-doped sensing regions formed in an n-type doped semiconductor substrate. Each pixel 120 detects light incident thereon by measuring photoinduced electric charge(s) generated in the respective doped sensing region 122. Semiconductor substrate 110 forms an array of wells 124 in a light-receiving surface 112 thereof. Each well 124 is embedded in a respective pixel 120 and aligned with the doped sensing region 122 of this pixel 120, i.e., the pair of co-aligned well 124 and doped sensing region 122 are at the same x- and y-locations. Each well 124 is configured to accommodate a light emitter 160, such that the pixel 120, in which well 124 is embedded, can detect light emitted by light emitter 160. Although shown in FIG. 1 as being exclusively below wells 124, each doped sensing region 122 may extend closer to light-receiving surface 112 and surround at least a portion of the corresponding well 124.

To reduce or eliminate crosstalk between different pixels 120, image sensor 100 further includes a grid of light-blocking barriers 132. Each barrier 132 is embedded in semiconductor substrate 110 along boundaries 130 between adjacent pixels 120, and optionally also around the perimeter of the array of pixels 120 as shown in FIG. 2. Barriers 132 may serve as deep-trench isolation between adjacent pixels 120. In a typical scenario, when light emitter 160 emits light, this light is emitted in all directions from light emitter 160. Thus, for a light emitter 160 disposed in one well 124, some of the emitted light propagates from light emitter 160 along a path that stays within the corresponding pixel 120, and the resulting photoinduced charge are collected by doped sensing region 122 (see, for example, light 170 in FIG. 1 propagating from well 124 of pixel 120(2) along the negative z-direction). However, other light may propagate from light emitter 160 in the direction toward an adjacent pixel 120 (see, for example, light 170 in FIG. 1 propagating from well 124 of pixel 120(2) in the direction toward adjacent pixels 120(1) and 120(3)). Barrier 132 around each pixel 120 helps prevent at least some of this light from reaching the adjacent pixels 120, where the light otherwise might result in generation of photoinduced electrical charge in doped sensing regions 122 of the adjacent pixels 120.

In certain embodiments, barriers 132 are at least partly reflective. In such embodiments, barriers 132 redirect light incident thereon back into the pixel 120 from which the light originated. Depending on the incidence angle of the light onto barrier 132 and the exact location of doped sensing regions 122 (e.g., with respect to the corresponding well 124), such back-reflected light may be redirected to doped sensing region 122 of the pixel 120 from which the light originated. Thus, in these embodiments, barriers 132 not only suppress crosstalk but also increase the light collection efficiency of pixel 120. Barriers 132 may include a metal, for example tungsten. Alternatively, barriers 132 may include a dielectric material. In one example, barriers 132 include a dielectric material having a lower index of refraction than semiconductor substrate 110, to promote total internal reflection of light incident on barriers 132 at a relatively shallow angle.

FIG. 1 shows image sensor 100 in an example use scenario where image sensor 100 is implemented in a device 102 for luminescence-based interrogation of a plurality of samples, each representing an example of light emitter 160. In addition to image sensor 100, device 102 includes a cover 150 that forms a fluidic chamber 158 on light-receiving surface 112 of image sensor 100. Cover 150 further forms at least two ports 156. Cover 150 may include (a) a dam 152 that forms an aperture over at least some of the array of pixels 120 and (b) a lid 154 that covers this aperture, such that dam 152 and lid 154 cooperate to form fluidic chamber 158. In embodiments, there exist a space or gap 158H between the light-receiving surface 112 and lid 154. Dam 152 and lid 154 may be two separate pieces or one integrally formed (e.g., molded) part. FIG. 2 shows the footprint 252 of dam 152 of light-receiving surface 112.

In the depicted example, cover 150 is configured such that fluidic chamber 158 is over the entirety of the array of pixels 120. Without departing from the scope hereof, cover 150 may instead be configured to form a fluidic chamber 158 over only a subset of the array of pixels 120, or cover 150 may be configured to form several fluidic chambers 158 over respective subsets of the array of pixels 120. Also, although ports 156 are depicted in FIG. 1 as being formed in lid 154, one or more ports 156 may instead be formed in dam 152, without departing from the scope hereof.

In operation of device 102, each sample (light emitter 160) is disposed in a different well 124, whereafter image sensor 100 monitors the response of samples to a fluid added to fluidic chamber 158 via at least one port 156. More specifically, if exposure of a sample to the fluid in fluidic chamber 158 results in luminescence, e.g., chemiluminescence, this luminescence may be detected by the pixel 120 in which sample is located.

Figure 3:
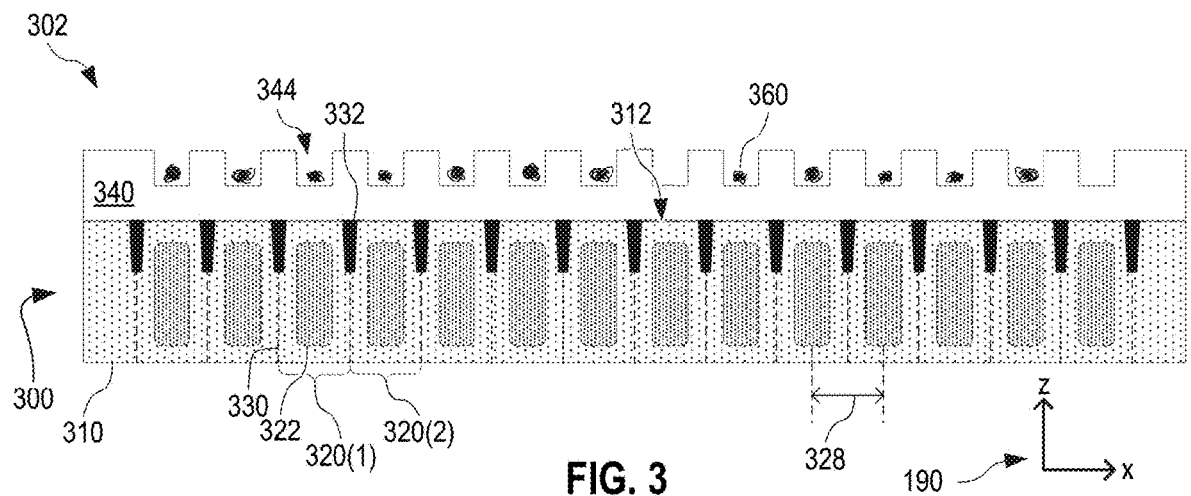
FIG. 3 shows an example device having wells on top of a light-receiving surface of a semiconductor substrate of an image sensor.

FIG. 3 shows, in a cross-sectional view similar to that of FIG. 1, a device 302 having sample wells on top of a light-receiving surface 312 of a semiconductor substrate 310 of an image sensor 300. In addition to image sensor 300, device 302 includes a structure 340 disposed on light-receiving surface 312 of semiconductor substrate 310. Structure 340 forms wells 344 configured to accommodate respective samples 360. Image sensor 300 includes (a) an array of photosensitive pixels 320 and (b) light-blocking deep-trench isolation 332 in semiconductor substrate 310 along boundaries 330 between adjacent pixels 320. Each pixel 320 includes a doped sensing region 322 of semiconductor substrate 310. Each well 344 is aligned with a respective doped sensing region 322, i.e., each well 344 is at the same x- and y-locations as a respective doped sensing region 322. For each well 344, the pixel 320 aligned therewith is configured to detect light emitted from a sample 360 disposed in the well 344 located above pixel 320.

Since wells 344 are on or above light-receiving surface 312, the light-collection efficiency by a pixel 320 of light emitted from a sample 360 in a corresponding well 344 is limited. Even in a best-case scenario, wherein the bottom of each well 344 coincides with light-receiving surface 312, at most half the solid angle of light emitted by a sample 360 in a well 344 reaches the corresponding pixel 320. In practice, less than half the solid angle of such emitted light is detectable by pixel 320. Furthermore, the light-blocking provided by deep-trench isolation 332 is exclusively below wells 344 (in the negative z-direction). As a result, some light emitted by a sample 360 disposed in one well 344 may pass above deep-trench isolation 332 to an adjacent pixel 320, thereby producing crosstalk. Such crosstalk is particularly prominent for instances of image sensor 300 characterized by a small pitch 328 of the array of pixels 320. Thus, especially instances of device 302 implementing a high-resolution image sensor 300 are affected by crosstalk.

Alternatively, device 302 may be provided without structure 340 and instead rely on samples 360 being attached to binding sites on light-receiving surface 312. However, this alternative version of device 302 suffers from the same issues with low light collection efficiency and high crosstalk as discussed above for device 302 with structure 340.

In comparison to image sensor 300, embedded wells 124 of image sensor 100 enables detection of a larger solid angle of light emitted by a light emitter 160 (e.g., a sample) disposed in a well 124. In addition, barriers 132 of image sensor 100 cooperate with embedded wells 124 to improve crosstalk suppression as compared to device 302 where samples 360 necessarily are above deep-trench isolation 332 in the z-direction.

Referring now again FIGS. 1 and 2, image sensor 100 is, by virtue of its improved sensitivity, particularly advantageous in scenarios where light emitters 160 emit only relatively little luminescence. Image sensor 100 may be able to detect luminescence that is below the detection threshold for device 302.

Device 102 may be used to perform deoxyribonucleic acid (DNA) sequencing. In one such example, DNA fragment samples are added to fluidic chamber 158 via a port 156. Each DNA fragment sample may be a DNA nanoball having many copies of the same DNA fragments. At least some of the DNA fragment samples attach to image sensor 100 in wells 124 in such a manner that, at least ideally, each well 124 contains at most one DNA fragment sample (which may include many copies of the same DNA fragment). Next, a series of solutions, each containing a respective nucleobase, are added to fluidic chamber 158 via a port 156. In this example scenario, binding of the nucleobase to a DNA fragment sample produces chemiluminescence. For each solution, image sensor 100 captures an image. In these images, an above-threshold level of light detected by a given pixel 120 indicates that the nucleobase was bound to the DNA fragment sample disposed in well 124 of that pixel 120. Thus, the series of images captured in this scheme provides the nucleobase sequence of each DNA fragment sample. Since the chemiluminescence generated in the binding process may be weak, the DNA sequencing accuracy may significantly benefit from the improved sensitivity of image sensor 100.

Figure 4:
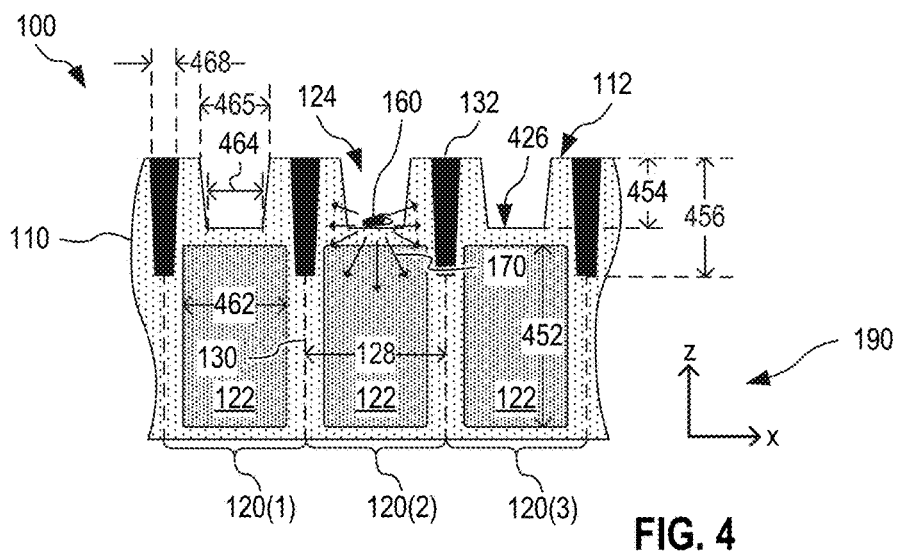
FIG. 4 shows the pixel configuration of the image sensor of FIGS. 1 and 2 in further detail.

FIG. 4 depicts, in cross-sectional view, three adjacent pixels 120(1), 120(2), and 120(3) of image sensor 100 to show the pixel configuration of image sensor 100 in further detail. Each well 124 has a span 454 in the z-dimension from the top of light-receiving surface 112 to a bottom 426 of well 124. Bottom 426 may be flat. Bottom 426 of well 124 has width 464, and the top of each well 124 has width 465. In one embodiment, each well 124 has a square cross section (as depicted in FIG. 2), and widths 464 and 465 are side lengths of the square cross section. In an alternative embodiment, each well 124 has a circular cross section, and widths 464 and 465 are diameters of the circular cross section. In another alternative embodiment, each well 124 has an oblong rectangular cross section, and widths 464 and 465 are diameters of the oblong rectangular cross section. Widths 464 and 465 may be identical, or width 465 may be greater than width 464 such that wells 124 are tapered. In one example, width 464 is in the range between 50 and 300 nanometers, width 465 is in the range between 100 and 1000 nanometers, and span 454 is in the range between 50 and 500 nanometers. In one scenario, light emitters 160 are disposed directly on bottom 426 or within 100 nanometers thereof. Without departing from the scope hereof, light-receiving surface 112 (including wells 124, and the trenches accommodating barriers 132) may be covered by one or more passivation layers/linings. In such embodiments, the dimensions listed here for width 464, width 465, and span 454 may applied to the wells as covered by such passivation layers/linings.

The width of each pixel 120 equals pitch 128. Each barrier 132 has width 468. Width 468 may be in the range between 100 and 500 nanometers. Pitch 128 is at least as large as the sum of widths 465 and 468. Pitch 128 may be in the range between 0.5 and 3.0 microns. Each doped sensing region 122 has width 462. Width 462 is less than pitch 128. Width 462 may exceed width 464, and width 462 may also exceed width 465.

Each doped sensing region 122 has a span 452 in the z-dimension. Span 452 may be non-overlapping with span 454 of wells 124 as shown in FIG. 4. Alternatively, in pixel 120, doped sensing region 122 extends above bottom 426, such that span 452 overlaps with span 454. In one example, doped sensing region 122 extends into a space between well 124 and adjacent barriers 132. Barriers 132 have a span 456 in the z-dimension, extending from the top of light-receiving surface 112 in the negative z-direction. Span 456 may be the same as span 454. However, more effective cross talk suppression may be achieved when span 456 exceeds span 454 (as shown in FIG. 4).

Figure 5:
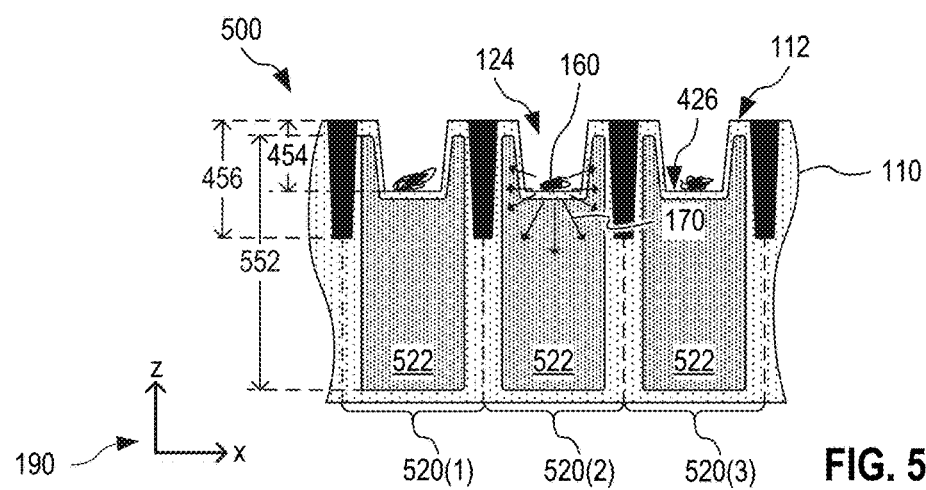
FIG. 5 illustrates an image sensor with wells that are embedded in the doped sensing regions, according to an embodiment.

FIG. 5 illustrates one image sensor 500 with wells that are embedded in the doped sensing regions. FIG. 5 depicts image sensor 500 in a view similar to that used for image sensor 100 in FIG. 4. Image sensor 500 is an embodiment of image sensor 300. Image sensor 500 includes an array of pixels 520 which are embodiments of pixels 120. Each pixel 520 includes a doped sensing region 522 formed in semiconductor substrate 110, for example by ion implantation. Doped sensing region 522 is an embodiment of doped sensing region 122. Each doped sensing region 522 is formed to extend close enough to light-receiving surface 112 to surround a portion of the corresponding well 124. In other words, the span 552 of each doped sensing region 522, in the z-dimension, overlaps with span 454 of well 124.

The configuration of doped sensing region 522 helps further improve the efficiency of detection of light 170 emitted by a light emitter 160 disposed in a well 124. In particular, light 170 emitted by light emitter 160 in a somewhat upwards direction (that is, in a direction that has a component in both the x-y dimensions and the positive z-direction) may lead to generate of photoinduced electric charge in the portion of doped sensing region 522 that is above bottom 426 of well 124. Consequently, pixel 520 is capable of detecting more than half the solid angle of light 170 emitted from light emitter 160.

Figure 6:
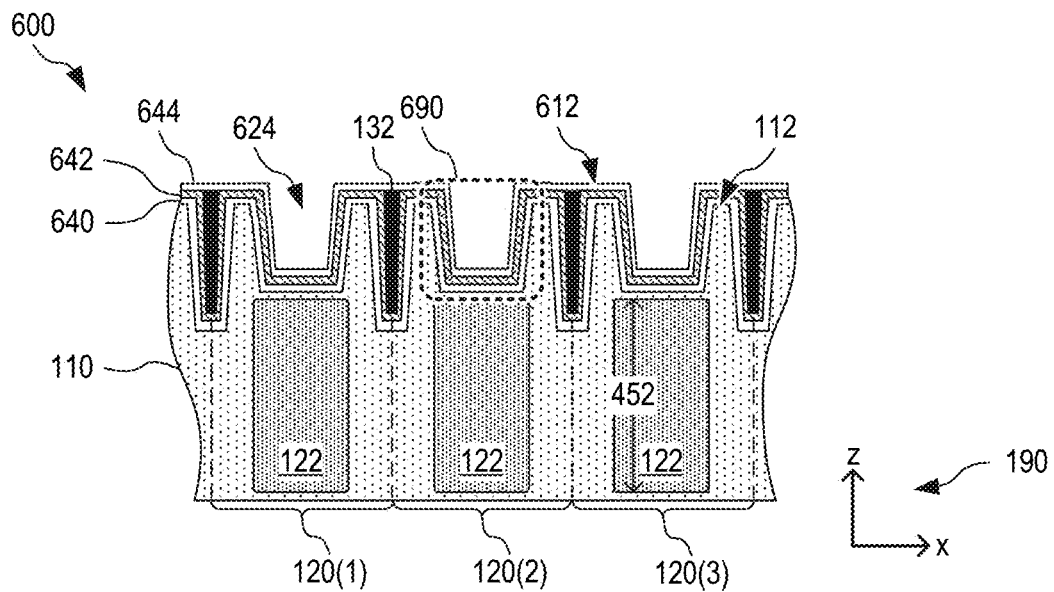
FIG. 6 illustrates an image sensor with embedded wells and a high-k passivation lining, according to an embodiment.

FIG. 6 illustrates one image sensor 600 with embedded wells and a high-k passivation lining. Image sensor 600 is an embodiment of image sensor 100. FIG. 6 shows image sensor 600 in a cross-sectional view similar to that used for image sensor 100 in FIG. 4. In image sensor 600, light-receiving surface 112 of semiconductor substrate 110 is lined with a high-k passivation lining 642. High-k passivation lining 642 is disposed on top of light-receiving surface 112, including surfaces of wells 624 and surfaces of the trenches in semiconductor substrate 110 accommodating barriers 132. A passivation layer 640 may be disposed between semiconductor substrate 110 and high-k passivation lining 642. In an example, each of passivation layer 640 and high-k passivation lining 642 is deposited conformal to inner surfaces of wells 624.

High-k passivation lining 642 is a dielectric material with a dielectric constant κ, for example greater than that of passivation layer 640. Passivation layer 640 serves to passivate the surface of semiconductor substrate 110. High-k passivation 642 has negative charges that push photoinduced electrons, located near the surface of semiconductor substrate 110, into doped sensing region 122, so as to prevent recombination of such electrons at the surface of semiconductor substrate 110 (such as at interfaces between well 624 and semiconductor substrate 110 material). In one embodiment, passivation layer 640 is silicon dioxide, and the dielectric constant κ of high-k passivation lining 642 is greater than 3.9 (the dielectric constant of silicon dioxide). In another embodiment, passivation layer 640 includes silicon nitride. High-k passivation lining 642 is or includes, for example, aluminum oxide ($Al_2O_3$), hafnium dioxide ($HfO_2$), zirconium dioxide ($ZrO_2$), titanium dioxide ($TiO_2$), or a combination thereof. In one embodiment, after depositing high-k passivation lining 642, trenches are filled with a filling material to form barriers 132. The filling material is, for example, a dielectric material such as silicon dioxide, or a reflective material such as metal.

Image sensor 100 may further include a passivation layer 644 covering high-k passivation lining 642. Passivation layer 644 may be formed by deposition and be conformal to high-k passivation lining 642. Passivation layer 644 may serve to provide a surface 612 for image sensor 600 (facing fluidic chamber 158 when image sensor 600 is implemented in device 102) that is suitable for placing light emitters 160 thereon. Passivation layer 644 may include silicon dioxide and/or silicon nitride.

Image sensor 600 forms lined wells 624. Each lined well 624 is a well 124 lined with high-k passivation lining 642, and optionally also one or both of passivation layers 640 and 644. Well 624 may have dimensions similar to those indicated for well 124 in FIG. 4.

Figure 7:
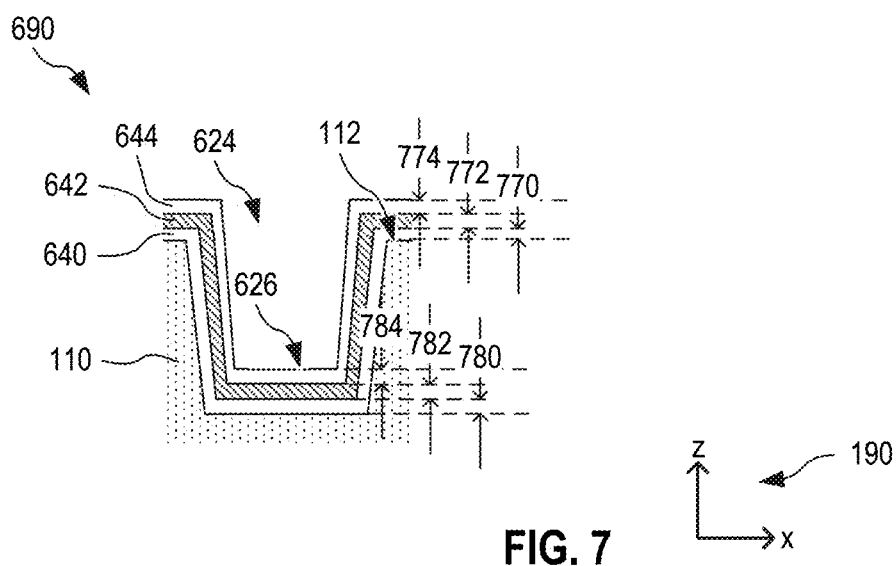
FIG. 7 is a more detailed view of a portion of the image sensor of FIG. 6.

FIG. 7 is a more detailed view of a portion 690 of image sensor 600 near well 624. High-k passivation lining 642 has thickness 772 at the top of light-receiving surface 112, and thickness 782 at the bottom 626 of well 624. Thicknesses 772 and 782 may be in the range between 3 and 100 nanometers. Passivation layer 640 has thickness 770 at the top of light-receiving surface 112, and thickness 780 at the bottom 626 of well 624. Thicknesses 770 and 780 may be in the range between 5 and 100 nanometers. Passivation layer 644 has thickness 774 at the top of light-receiving surface 112, and thickness 784 at the bottom 626 of well 624. Thickness 784 may be in the range between 1 and 200 nanometers. Thickness 774 may be similar to thickness 784 or greater.

Without departing from the scope hereof, image sensor 600 may implement doped sensing regions 522.

Figure 8:
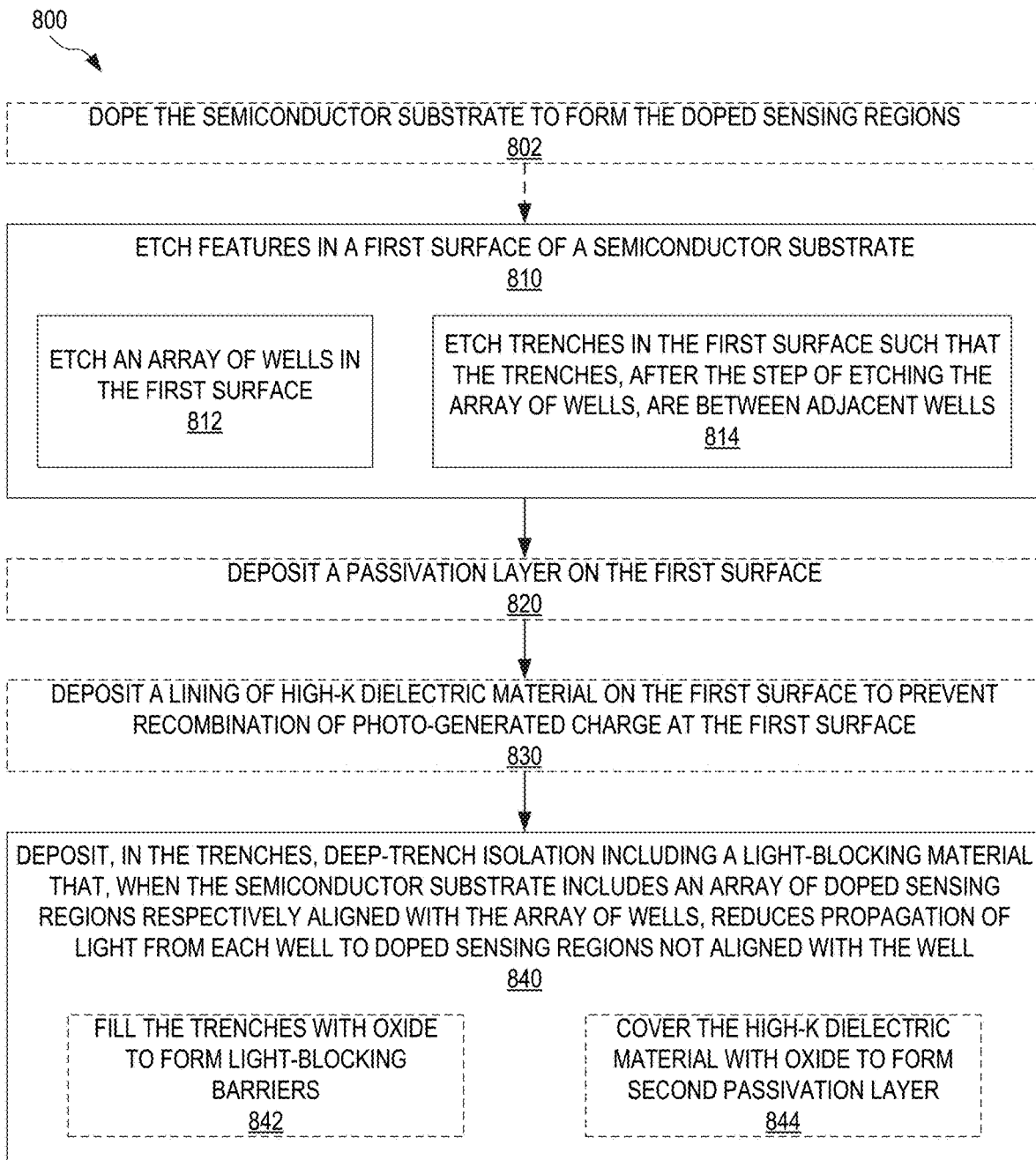
FIG. 8 illustrates a method for manufacturing an image sensor with embedded wells for accommodating light emitters, according to an embodiment.

FIG. 8 illustrates one method 800 for manufacturing an image sensor with embedded wells for accommodating light emitters. Method 800 may be used to manufacture image sensor 100. Method 800 includes steps 810 and 840. Step 810 includes steps 812 and 814. Step 812 etches an array of wells in a first surface of a semiconductor substrate. Step 814 etches trenches in the first surface such that the trenches, after completion of step 812, are between adjacent wells. Step 840 deposits, in the trenches formed in step 814, deep-trench isolation including a light-blocking material that, when the semiconductor substrate includes an array of doped sensing regions respectively aligned with the array of wells, the light-blocking material reduces propagation of light from each well to doped sensing region not aligned with the well.

Method 800 may include one or both of steps 820 and 830, performed between steps 810 and 840. Step 820 deposit a passivation layer on the first surface. Step 830 deposits a lining of high-k dielectric material on the first surface to prevent recombination of photo-generated charge at the first surface inducing dark current and white pixels. In embodiments of method 800 that include both step 820 and step 830, step 830 deposits the lining of high-k dielectric material on the passivation layer deposited in step 820. Each of steps 820 and 830 may utilize chemical vapor deposition, plasma vapor deposition, or atomic layer deposition.

Figure 9A:
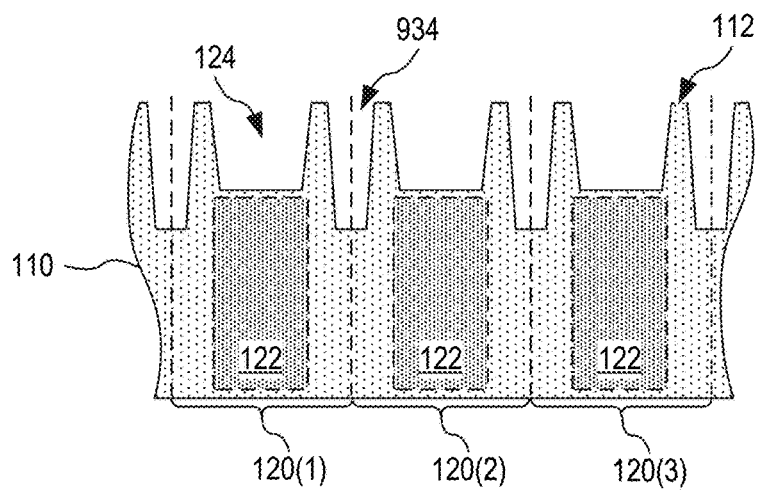
FIGS. 9A-D are diagrams of examples of certain steps of the method of FIG. 8.

FIG. 9A shows one example of step 810. In this example, step 812 etches wells 124 in light-receiving surface 112 of semiconductor substrate 110, and step 814 etches trenches 934 in light-receiving surface 112 of semiconductor substrate 110 between adjacent wells 124. Step 812 and/or step 814 may be performed before or after forming doping semiconductor substrate 110 to form doped sensing regions 122 in pixels 120. Trenches 934 and wells 124 may have the same depth, or be deeper than each of wells 124 with respect to light-receiving surface 112. In some embodiments, trenches 934 are less deep than wells 124.

Figure 9B:
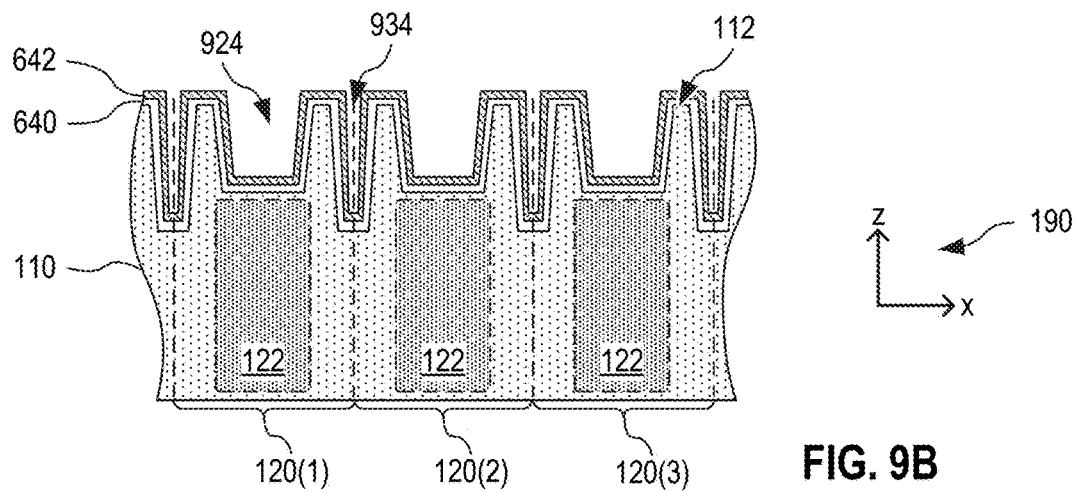

FIG. 9B shows one example of steps 820 and 830, wherein passivation layer 640 and/or high-k passivation lining 642 are deposited on light-receiving surface 112, including in trenches 934 and in wells 124 (to form lined wells 924).

Figure 9C:
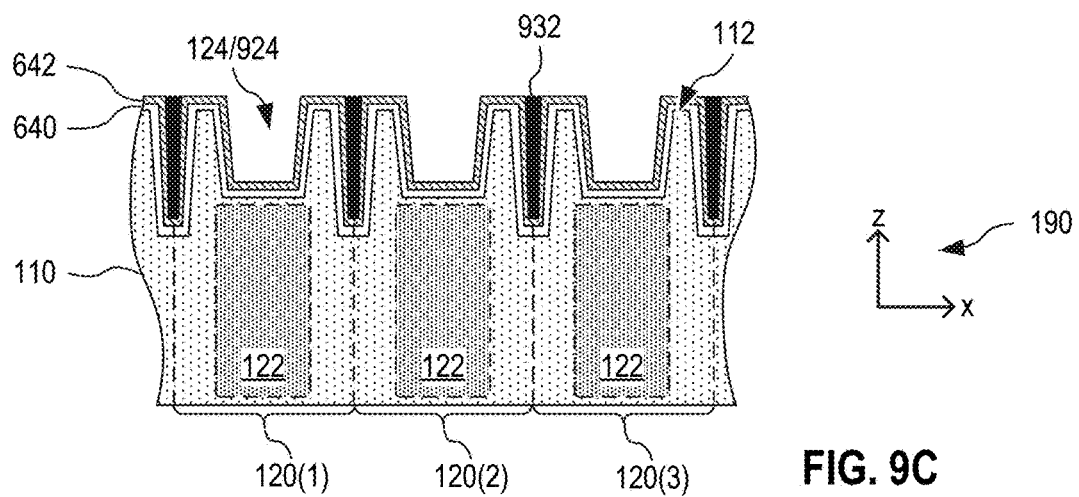

FIG. 9C shows one example of step 840. In this example, trenches 934 are filled with light-blocking deep-trench isolation 932. Deep-trench isolation 932 may be similar or identical to barriers 132. In embodiments where the deep trench isolation is filled with metal material, e.g., tungsten or aluminum, well 124 may be covered by photoresist material or sacrificial oxide material before metal deposition. After metal deposition, the photoresist material or sacrificial oxide material is removed, for example by an etching process, to form an opening in each of wells 124. Thereafter, oxide may be deposited into wells 124 to form an oxide lining layer that lines sidewalls of wells 124.

Referring again to FIG. 8, one embodiment of method 800 includes a step 802 of doping the semiconductor substrate to form the doped sensing regions. Step 802 may be performed before step 810, as shown in FIG. 8, or step 802 may be performed at a later stage in method 800. In one example of step 802, semiconductor substrate 110 is doped to form doped sensing regions 122 (optionally in the form of doped sensing regions 522).

Figure 9D:
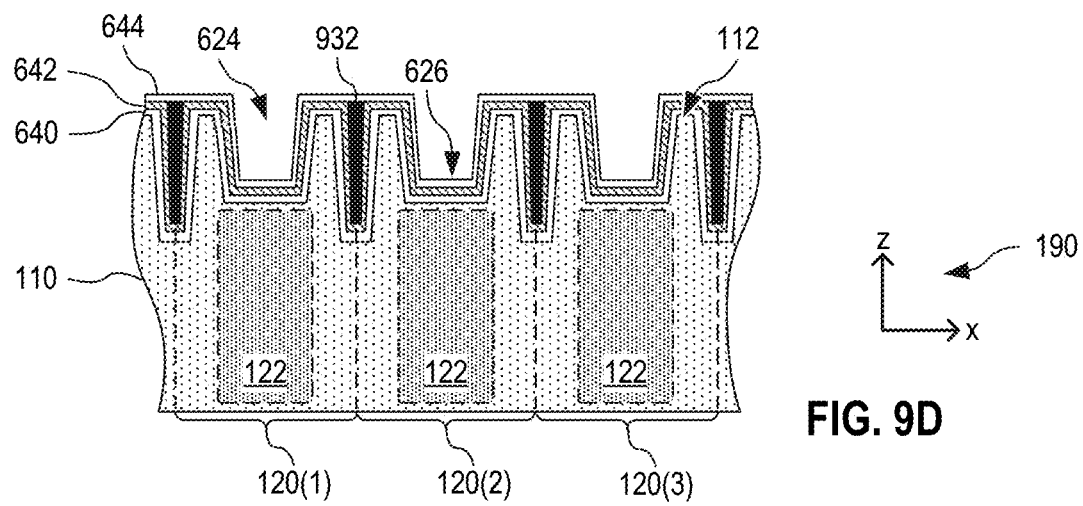

In one embodiment, the deep-trench isolation deposited in step 840 is an oxide, method 800 includes step 830, and step 840 includes steps 842 and 844. In this embodiment, the oxide may be a dielectric material having a lower index of refraction than the semiconductor substrate, such as silicon oxide to promote total internal reflection of light incident on the barrier in the trenches at a relatively shallow angle. In this embodiment, one deposition process both (a) fills the trenches with oxide to form light-blocking barriers (in step 842) and (b) covers the lining of high-k dielectric material with oxide to form a second passivation layer on top of the lining of high-k dielectric material. This embodiment of step 840 may utilize chemical vapor deposition, plasma vapor deposition, or atomic layer deposition. In this embodiment, the trenches are narrower than the wells such that, when the deposition process has filled the trenches with the oxide, a lining of oxide has accumulated on the entire surface of the lining of high-k dielectric material. In one embodiment, the second passivation layer formed through oxide deposition may further extend across the entire surface. FIG. 9D shows one example of step 844. In this example, step 844 covers high-k dielectric passivation lining 642 with an oxide material and etches the oxide to (a) reopen wells 924 to form wells 624 while (b) the remaining oxide material forms a passivation layer 644. Step 844 may further include thinning the portion of passivation layer 644 located above the top of light-receiving surface 912 and covering deep-trench isolation 932. As depicted in FIG. 9D, deep-trench isolation 932 may extend deeper into semiconductor substrate 110 than bottom 626 of lined wells 624.

In another embodiment, the deep-trench isolation deposited in step 840 includes a metal, such as tungsten and/or aluminum, and method 800 includes steps 820 and 830. The metal may block light by reflection and/or absorption. In this embodiment, step 840 may include the following steps in the order listed: (1) depositing a mask material, e.g., sacrificial oxide, on the surface of the semiconductor substrate (e.g., on the high-k dielectric material deposited in step 830) to fill the trenches and the wells and cover the entire light-receiving surface of the semiconductor substrate such that no metal would be deposited in the wells; (2) chemical-mechanical polishing the mask material (e.g., sacrificial oxide) for subsequent processes (e.g., lithography and etching process); (3) reopening the trenches of deposition of deep-trench isolation; (4) depositing metal in the trenches; (5) reopening the wells; and (6) depositing an oxide across the entire surface and lining inner surfaces of wells to form a second passivation layer.

Method 800 may, without departing from the scope hereof, further include forming control and readout circuitry on the side of the semiconductor substrate that is opposite the side of the semiconductor substrate forming wells. In one example, control and readout circuitry is formed on the side of semiconductor substrate that is opposite light-receiving surface 112.

Figure 10:
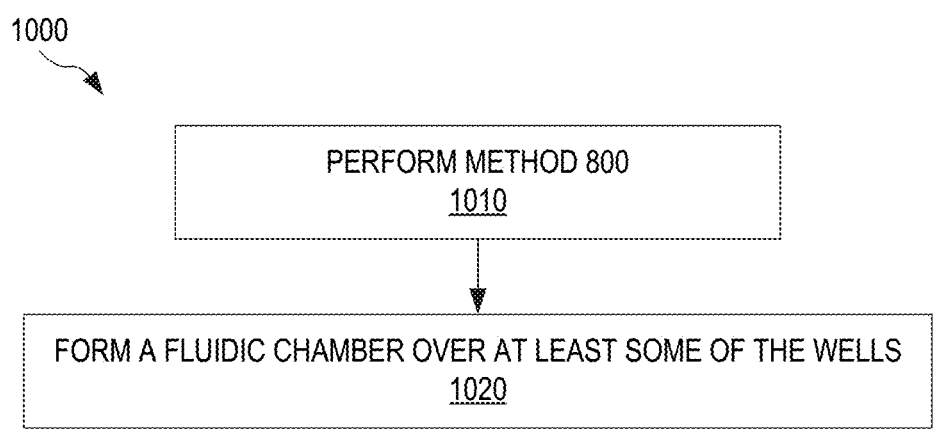
FIG. 10 illustrates a method for manufacturing a device for luminescence-based interrogation of a plurality of light emitters, according to an embodiment.

FIG. 10 illustrates one method 1000 for manufacturing a device for luminescence-based interrogation of a plurality of light emitters. Method 1000 may be used to manufacture device 102. Method 1000 includes steps 1010 and 1020. Step 1010 performs method 800 to form an image sensor having embedded wells, such as image sensor 100. Step 1020 forms a fluidic chamber over at least some of the wells. In one example of step 1020, method 1000 places cover 150 on light-receiving surface 112 of image sensor 100 such that cover 150 forms fluidic chamber 158 over at least a portion of the array of wells 124.

Figure 11:
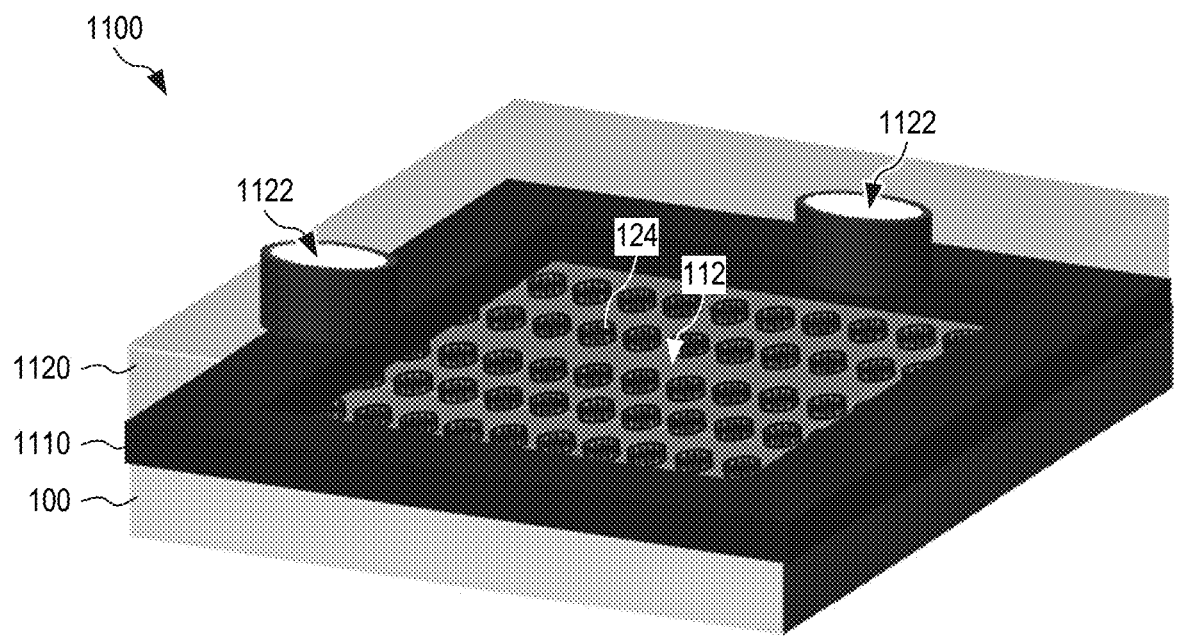
FIG. 11 schematically illustrates a device for luminescence-based interrogation of a plurality of light emitters, according to an embodiment.

FIG. 11 schematically illustrates one device 1100 for luminescence-based interrogation of a plurality of light emitters. Device 1100 is an embodiment of device 102 and includes image sensor 100, a dam 1110, and a lid 1120. Dam 1110 is disposed on light-receiving surface 112 and surrounds at least a portion of the array of wells 124. Dam 1110 forms an aperture over a portion of light-receiving surface 112. Lid 1120 covers the aperture formed by dam 1110 to form a fluidic chamber similar to fluidic chamber 158. In one embodiment, dam 1110 is positioned outside the array of wells 124. In this embodiment, dam 1110 may have a footprint similar to footprint 252 indicated in FIG. 2. In another embodiment, dam 1110 covers some of the array of wells 124, and the covered wells 124 are not accessible from the fluidic chamber formed by dam 1110 and lid 1120. Lid 1120 forms at least two ports 1122. In one scenario, ports 1122 are connected to external equipment that supplies samples (for example DNA polymer chains) and known polymer-based chain to flow into and out of the fluidic chamber (e.g., fluidic chamber 158). Without departing from the scope hereof, dam 1110 and lid 1120 may be integrally formed.

In an extension of device 1100, dam 1110 is modified to form two or more separate apertures over light-receiving surface 112. In this extension, dam 1110 and lid 1120 cooperate to form two or more separate fluidic chambers on light-receiving surface 112, and lid 1120 may include two ports 1122 for each of these fluidic chambers.

Figure 12:
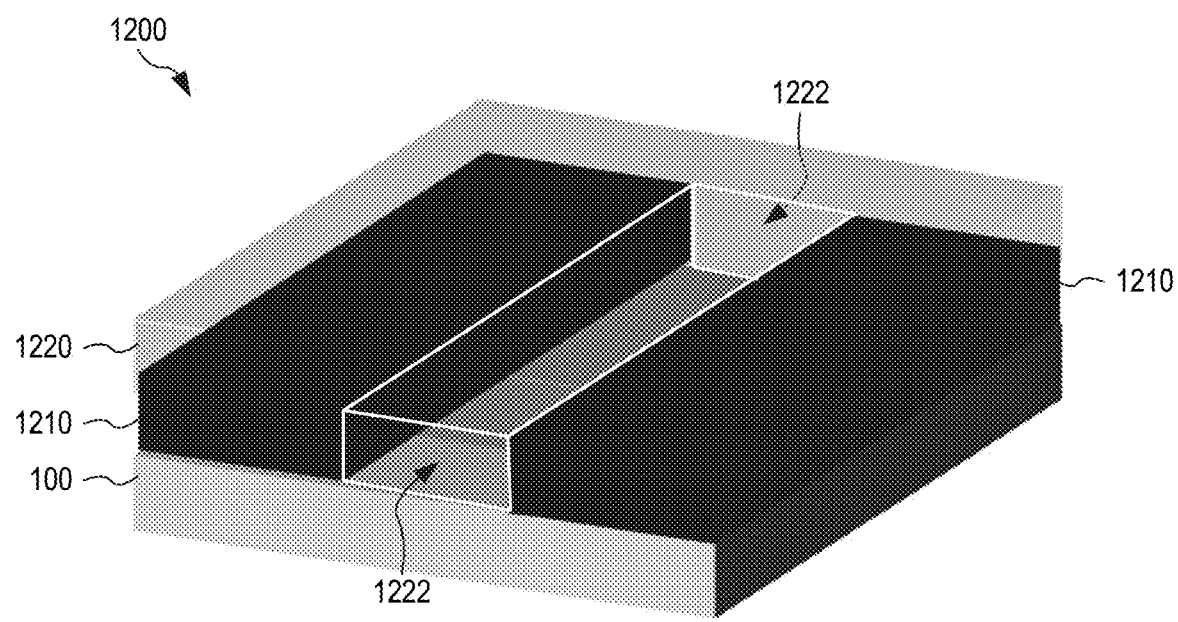
FIG. 12 schematically illustrates another device for luminescence-based interrogation of a plurality of light emitters, according to an embodiment.

FIG. 12 schematically illustrates another device 1200 for luminescence-based interrogation of a plurality of samples. Device 1200 is an embodiment of device 102 and includes image sensor 100, two dams 1210, and a lid 1220. Dams 1210 are disposed on two different parts of light-receiving surface 112 a distance apart from each other such that a portion of the array of wells 124 is uncovered by dams 1210. Lid 1220 covers the space between dams 1210 to form a fluidic chamber similar to fluidic chamber 158. This fluidic chamber has two ports 1222 where the perimeter of lid 1220 spans over a gap between the two dams 1210. In one embodiment, dams 1210 are positioned outside the array of wells 124. In another embodiment, at least one of dams 1210 covers some of the array of wells 124, and the covered wells 124 are not accessible from the fluidic chamber formed by dams 1210 and lid 1220. Without departing from the scope hereof, dams 1210 and lid 1220 may be integrally formed.

In an extension, device 1200 includes three of more dams 1210 that cooperate with lid 1220 to form two or more separate fluidic chambers on light-receiving surface 112.

Combinations of Features

Features described above as well as those claimed below may be combined in various ways without departing from the scope hereof. For example, it will be appreciated that aspects of one image sensor or associated method, described herein, may incorporate features or swap features of another image sensor or associated method described herein. The following examples illustrate some possible, non-limiting combinations of embodiments described above. It should be clear that many other changes and modifications may be made to the methods, products, and systems herein without departing from the spirit and scope of this invention:

(A1) One image sensor, with embedded wells for accommodating light emitters, includes a semiconductor substrate including an array of doped sensing regions respectively corresponding to an array of photosensitive pixels of the image sensor. The semiconductor substrate forms an array of wells. Each well is aligned with a respective doped sensing region to facilitate detection, by the photosensitive pixel that includes said respective doped sensing region, of light emitted to the photosensitive pixel by a light emitter disposed in the well. The image sensor further includes, between adjacent doped sensing regions, a light-blocking barrier to reduce propagation of light to the doped sensing-region of each photosensitive pixel from wells not aligned therewith.

(A2) In the image sensor denoted as (A1), the light barriers may be at least partly reflective.

(A3) In either of the image sensors denoted as (A1) and (A2), the wells may be in a light-receiving surface of the semiconductor substrate, and the light-blocking barrier may span, in the dimension orthogonal to plane of the array of doped sensing regions, at least from a top of the light-receiving surface of the semiconductor substrate to below a bottom of the wells.

(A4) In any of the image sensors denoted as (A1) through (A3), each doped sensing region may span, in dimension orthogonal to plane of the array of photosensitive pixels, at least from above to below a bottom of the wells.

(A5) In any of the image sensors denoted as (A1) through (A4), the wells may be in a light-receiving surface of the semiconductor substrate, and the image sensor may further include one or more top layers disposed on the light-receiving surface and lining the array of wells to form an array of lined wells. The one or more top layers include at least one passivation layer.

(A6) In the image sensor denoted as (A5), the light-blocking barrier may have a first span in a first dimension orthogonal to plane of the array of photosensitive pixels, and the first span may be at least from a top of the light-receiving surface to below a bottom of the lined wells.

(A7) In the image sensor denoted as (A6), each doped sensing region may have a second span in the first dimension, the second span overlapping with the first span.

(A8) In the image sensor denoted as (A7), the second span may be at least from above a bottom of the lined wells to below a bottom of the wells.

(A9) In the image sensor denoted as (A7), the second span may be exclusively below a bottom of the wells.

(A10) In any of the image sensors denoted as (A5) through (A9), the one or more top layers may include (a) a first passivation layer disposed on the light-receiving surface, (b) a high-k dielectric layer disposed on the first passivation layer, and (c) a second passivation layer disposed on the high-k dielectric layer.

(A11) In the image sensor denoted as (A10), the semiconductor substrate may form trenches between adjacent photosensitive pixels, with the first passivation layer and the high-k dielectric layer lining the trenches and with the light-blocking barrier being light-blocking deep-trench isolation disposed in the trenches on the high-k dielectric layer.

(A12) In any of the image sensors denoted as (A5) through (A11), a bottom of each lined well may be between 50 and 300 nanometers below a top of the semiconductor substrate, each lined well may have width in the range being between 50 and 1000 nanometers, and the array of photosensitive pixels may be characterized by a pitch in the range between 0.5 and 3.0 microns.

(A13) In any of the image sensors denoted as (A5) through (A12), each lined well may have a planar bottom surface.

(A14) In any of the image sensors denoted as (A1) through (A4), a bottom of each well may be between 50 and 300 nanometers below a top of the semiconductor substrate, each well may have width in the range being between 50 and 1000 nanometers, and the array of photosensitive pixels may be characterized by a pitch in the range between 0.5 and 3.0 microns.

(A15) In any of the image sensors denoted as (A14) and (A1) through (A4), each well may have a planar bottom surface.

(A16) One device for luminescence-based interrogation of a plurality of samples includes any one of the image sensors denoted as (A1) through (A16) (wherein each light emitter is a sample), and a cover disposed on side of the image sensor having the wells. The cover forms (a) a fluidic chamber over at least some of the wells, (b) an inlet port for receiving a fluid into the fluidic chamber to interact with the plurality of samples when each of the samples is disposed in a respective one of the wells accessible from the fluidic chamber, and (c) an outlet port for cooperating with the inlet port to allow flow of the fluid through the sample chamber.

(B1) One method for manufacturing an image sensor, with embedded wells for accommodating light emitters, includes (a) etching an array of wells in a first surface of a semiconductor substrate, (b) etching trenches in the first surface such that the trenches, after the step of etching the array of wells, are between adjacent wells, and (c) depositing, in the trenches, deep-trench isolation including a light-blocking material that, when the semiconductor substrate includes an array of doped sensing regions respectively aligned with the array of wells, reduces propagation of light from each well to doped sensing region not aligned with the well.

(B2) The method denoted as (B1) may further include, after the steps of etching the array of wells and the trenches and before the step of depositing the deep-trench isolation, depositing a lining of high-k dielectric material on the first surface to prevent recombination of photo-generated charge at the first surface, such that the deep-trench isolation is deposited on the lining of high-k dielectric material in the step of depositing the deep-trench isolation.

(B3) The method denoted as (B2) may further include (i) before the step of depositing the high-k dielectric material, depositing a first passivation layer on the first surface, and (ii) in the step of depositing the deep-trench isolation, (1) filling the trenches with an oxide to form light-blocking barriers and (2) covering the lining of high-k dielectric material with the oxide to form a second passivation layer, such that the lining of high-k dielectric material is deposited on the first passivation layer in the step of depositing the high-k dielectric material.

(B4) Any of the methods denoted as (B1) through (B3) may further include doping the semiconductor substrate to form the array of doped sensing regions such that each doped sensing region, after the steps of etching the array of wells and etching the trenches, extends from a maximum depth to a minimum depth below the first surface, wherein the minimum depth is less than each of the depth of the trenches below the first surface and the depth of the wells below the first surface.

(B5) Any of the methods denoted as (B1) through (B3) may further include doping the semiconductor substrate to form the array of doped sensing regions such that (I) each doped sensing region, after the steps of etching the array of wells and etching the trenches, has a first span in a first dimension orthogonal to the array of doped sensing regions, the first span being exclusively below the array of wells, and (II) the light blocking material has a second span in the first dimension, the second span extending to a top of the first surface and overlapping with the first span.

(B6) One method for manufacturing a device for luminescence-based interrogation of a plurality of light emitters includes performing any one of the methods denoted as (B1) through (B5), and forming a fluidic chamber over at least some of the wells.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. An image sensor with a plurality of wells for accommodating light emitters, comprising:
   a semiconductor substrate including an array of doped sensing regions respectively corresponding to an array of photosensitive pixels of the image sensor, wherein a light receiving surface of the semiconductor substrate forms the array of wells, each of the wells extended a depth from the first surface of the semiconductor substrate into the semiconductor substrate, each well being aligned with a respective doped sensing region to facilitate detection, by the photosensitive pixel that includes said respective doped sensing region, of light emitted to the photosensitive pixel by a light emitter disposed in the well, wherein the semiconductor substrate further comprises a silicon substrate; and
   a grid of light-blocking barriers formed along boundaries between adjacent pixels of the array of photosensitive pixels to reduce propagation of light to the doped sensing-region of each photosensitive pixel from wells not aligned therewith.

2. The image sensor of claim 1, the light-blocking barrier being at least partly reflective.

3. The image sensor of claim 1, the wells being in a light-receiving surface of the semiconductor substrate, the light-blocking barrier spanning, in dimension orthogonal to plane of the array of doped sensing regions, at least from a top of the light-receiving surface of the semiconductor substrate to below a bottom of the wells.

4. The image sensor of claim 1, each doped sensing region spanning, in dimension orthogonal to plane of the array of photosensitive pixels, at least from above to below a bottom of the wells.

5. The image sensor of claim 1, the wells being in a light-receiving surface of the semiconductor substrate, the image sensor further comprising one or more top layers disposed on the light-receiving surface and lining the array of wells to form an array of lined wells, the one or more top layers including at least one passivation layer.

6. The image sensor of claim 5, the light-blocking barrier having a first span in a first dimension orthogonal to plane of the array of photosensitive pixels, the first span being at least from a top of the light-receiving surface to below a bottom of the lined wells.

7. The image sensor of claim 6, each doped sensing region having a second span in the first dimension, the second span overlapping with the first span.

8. The image sensor of claim 7, the second span being at least from above a bottom of the lined wells to below a bottom of the wells.

9. The image sensor of claim 7, the second span being exclusively below a bottom of the wells.

10. The image sensor of claim 5, the one or more top layers being disposed conformal to inner surfaces of each of the wells, the one or more top layers including:
    a first passivation layer disposed on the light-receiving surface;
    a high-k dielectric layer disposed on the first passivation layer; and
    a second passivation layer disposed on the high-k dielectric layer.

11. The image sensor of claim 10, the semiconductor substrate further forming trenches between adjacent photosensitive pixels, the first passivation layer and the high-k dielectric layer lining the trenches, the light-blocking barrier being light-blocking deep-trench isolation disposed in the trenches on the high-k dielectric layer.

12. The image sensor of claim 1, a bottom of each well being between 50 and 300 nanometers below a top of the semiconductor substrate, each well having width in a range being between 50 and 1000 nanometers, the array of photosensitive pixels being characterized by a pitch in a range between 0.5 and 3.0 microns.

13. The image sensor of claim 1, each well having a planar bottom surface wherein the respective doped sensing region surrounds at least a portion of the corresponding well.

14. A device for luminescence-based interrogation of a plurality of samples, comprising:
    the image sensor of claim 1, wherein each light emitter is a sample; and
    a cover disposed on side of the image sensor having the wells, the cover forming (a) a fluidic chamber over at least some of the wells, (b) an inlet port for receiving a fluid into the fluidic chamber to interact with the plurality of samples when each of the samples is disposed in a respective one of the wells accessible from the fluidic chamber, and (c) an outlet port for cooperating with the inlet port to allow flow of the fluid through the sample chamber.

15. A method for manufacturing an image sensor with a plurality of wells for accommodating light emitters, comprising:
    etching an array of wells in a first surface of a semiconductor substrate, each of the wells extended a depth from the first surface of the semiconductor substrate into the semiconductor substrate, wherein the semiconductor substrate further comprises a silicon substrate;
    etching a grid of trenches in the first surface such that the trenches, after the step of etching the array of wells, are between adjacent wells; and
    depositing, in the trenches, deep-trench isolation including a light-blocking material that, when the semiconductor substrate includes an array of doped sensing regions respectively aligned with the array of wells, reduces propagation of light from each well to doped sensing region not aligned with the well.

16. The method of claim 15, further comprising:
    after the steps of etching the array of wells and the trenches and before the step of depositing the deep-trench isolation, depositing a lining of high-k dielectric material on the first surface to prevent recombination of photo-generated charge at the first surface;
    wherein the deep-trench isolation is deposited on the lining of high-k dielectric material in the step of depositing the deep-trench isolation.

17. The method of claim 16, the deep-trench isolation being an oxide, the method further comprising:

before the step of depositing the high-k dielectric material, depositing a first in the step of depositing the deep-trench isolation:
  filling the trenches with the oxide to form light-blocking barriers, and covering the lining of high-k dielectric material with the oxide to form a second passivation layer;
  wherein the lining of high-k dielectric material is deposited on the first passivation layer in the step of depositing the high-k dielectric material.

18. The method of claim 15, further comprising doping the semiconductor substrate to form the array of doped sensing regions such that each doped sensing region, after the steps of etching the array of wells and etching the trenches, extends from a maximum depth to a minimum depth below the first surface, the minimum depth being less than each of (a) depth of the trenches below the first surface and (b) depth of the wells below the first surface.

19. The method of claim 15, further comprising doping the semiconductor substrate to form the array of doped sensing regions such that (a) each doped sensing region, after the steps of etching the array of wells and etching the trenches, has a first span in a first dimension orthogonal to the array of doped sensing regions, the first span being exclusively below the array of wells, and (b) the light blocking material has a second span in the first dimension, the second span extending to a top of the first surface and overlapping with the first span.

20. A method for manufacturing a device for luminescence-based interrogation of a plurality of light emitters, comprising:
  performing the method of claim 15; and
  forming a fluidic chamber over at least some of the wells.

* * * * *